United States Patent
Walukiewicz et al.

(10) Patent No.: US 6,759,312 B2
(45) Date of Patent: Jul. 6, 2004

(54) CO-IMPLANTATION OF GROUP VI ELEMENTS AND N FOR FORMATION OF NON-ALLOYED OHMIC CONTACTS FOR N-TYPE SEMICONDUCTORS

(75) Inventors: Wladyslaw Walukiewicz, Kensington, CA (US); Kin M. Yu, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 5 days.

(21) Appl. No.: 10/272,280

(22) Filed: Oct. 16, 2002

(65) Prior Publication Data

US 2003/0129820 A1 Jul. 10, 2003

Related U.S. Application Data

(60) Provisional application No. 60/330,053, filed on Oct. 16, 2001.

(51) Int. Cl.[7] ............................................. H01L 21/322
(52) U.S. Cl. ........................ 438/473; 438/167; 438/520; 438/407; 438/515; 438/37; 438/46; 438/379; 438/606; 148/171; 148/175; 148/187; 357/17; 357/63; 357/89; 357/90
(58) Field of Search .................. 438/473, 167, 438/520, 407, 515, 37, 46, 606, 379; 148/171, 175, 187; 357/17, 63, 89, 90

(56) References Cited

U.S. PATENT DOCUMENTS

| | | | | |
|---|---|---|---|---|
| 4,001,056 A | * | 1/1977 | Groves et al. | 438/37 |
| 4,033,788 A | * | 7/1977 | Hunsperger et al. | 438/167 |
| 4,383,869 A | * | 5/1983 | Liu | 438/520 |
| 4,668,306 A | * | 5/1987 | Nishizawa | 438/379 |
| 5,158,897 A | * | 10/1992 | Sato et al. | 438/515 |
| 5,616,178 A | * | 4/1997 | Toda et al. | 117/104 |
| 5,822,347 A | * | 10/1998 | Yokogawa et al. | 372/45 |
| 5,865,897 A | * | 2/1999 | Ito et al. | 118/723 MR |
| 6,083,324 A | * | 7/2000 | Henley et al. | 148/33.2 |
| 6,110,278 A | * | 8/2000 | Saxena | 117/95 |
| 6,342,405 B1 | * | 1/2002 | Major et al. | 438/46 |
| 2001/0039098 A1 | * | 11/2001 | Lu | 438/407 |

* cited by examiner

*Primary Examiner*—Matthew Smith
*Assistant Examiner*—Victor Yevsikov
(74) *Attorney, Agent, or Firm*—Charles R. Nold; Lawrence Berkeley National Laboratory

(57) ABSTRACT

Non-alloyed, low resistivity contacts for semiconductors using Group III-V and Group II-VI compounds and methods of making are disclosed. Co-implantation techniques are disclosed.

12 Claims, 8 Drawing Sheets

CO-IMPLANTATION OF GROUP VI ELEMENTS AND N FOR FORMATION OF NON-ALLOYED OHMIC CONTACTS FOR N-TYPE SEMICONDUCTORS

CROSS REFERENCE TO RELATED APPLICATIONS

This applications claims priority to U.S. Serial No. 60/330,053, filed Oct. 16, 2001 the contents of which are hereby incorporated by reference in their entirety for all purposes.

STATEMENT REGARDING FEDERALLY SPONSORED RESEARCH OR DEVELOPMENT

The invention described and claimed herein was made in part utilizing funds supplied by the United States Department of Energy under contract No. DE-AC0376SF000-98 between the U.S. Department of Energy and The Regents of the University of California. The government has certain rights to the invention.

BACKGROUND OF THE INVENTION

Group III-V semiconductor materials such as gallium arsenide (GaAs), indium phosphide (InP) and their related alloys are important materials used in many different electronic and optoelectronic devices. In particular, such semiconductor materials are used in high speed transistors as well as in optoelectronic applications such as vertical-cavity surface-emitting lasers (VCSELs), in-plane lasers, and light-emitting diodes (LEDs) structured to emit light in a wide range of wavelengths from red through ultra-violet. In the following description, the term gallium arsenide material will be understood to refer to any of the above-mentioned semiconductor materials.

Semiconductor devices made from gallium arsenide materials commonly include one or more electrical contacts through which electric current received via a bonding wire is distributed across the surface of the gallium arsenide material for conduction through the bulk or thin surface layer of the gallium arsenide material. These contacts are commonly referred to as Ohmic contacts to a semiconductor device. To minimize heat generation and reduce power consumption in the semiconductor device, the electrical resistance of the electrical contact, and the voltage drop across the contact, should be minimized.

Depending on the specific device, Ohmic contacts were fabricated on either n-type (materials doped with donors) or p-type (materials doped with acceptors) gallium arsenide materials. The contact resistance on a semiconductor depends critically on the free carrier concentration (either electrons or holes) in the material. In order to obtain an Ohmic contact with low resistivity, the material has to have high carrier concentration. In gallium arsenide materials, it is well-known that highly n-type material cannot be obtained because of the limitation in n-type doping in the materials. Consequently, reliable low resistance ohmic contacts on n-type gallium arsenide are difficult to realize. The current standard state-of-the-art non-alloyed ohmic contacts to n-type GaAs utilize either Au—Ge alloys, multi-component metallization e.g. MoGeInW, MoGeW, NiInW or heteroepitaxial structures such as graded $In_xGa_{1-x}As$. The Au—Ge contacts have relatively low resistivity of $\sim 10^{-6}$ ohm-cm$^2$. However due to the low melting point of Au—Ge (eutectic temperature of 360° C.) these contacts are laterally non-uniform and have very poor surface morphology that is detrimental in optoelectronic and microscale device applications. The two main concerns with multi-component metallization are the reliability and the planar morphology of the contact. Such complications on contacts limit the miniaturization of devices. Moreover, the minimum resistance of the multi-component contacts is still limited by the near-surface doping level of the GaAs material. Contacts fabricated using graded heterojunctions can in principle achieve very low contact resistance with excellent planarity. However, such contacts can be fabricated only through an epitaxial growth process and therefore is expensive and is incompatible with current device fabrication facilities. The current invention facilitates a large enhancement of the electrical activation in a near-surface n-type GaAs layer. Such an enhancement in n-type doping will be particularly useful in the fabrication of low resistivity, nonalloyed ohmic contacts to n-type GaAs.

Ohmic contacts to n-type Group II-VI semiconductors are also possible using the same inventive steps realized for the development of the n-type GaAs.

BRIEF SUMMARY OF THE INVENTION

The invention provides a method to fabricate low resistivity non-alloyed ohmic contacts on devices with a n-type gallium arsenide surface. This is achieved by the large enhancement of the n-type doping in GaAs by the co-implantation of N and a group VI donor species (S, Se and Te) in GaAs. The role of the N is to modify the conduction band structure of GaAs so that high free electron concentration can be attained by the group VI donors. This method can also be extended to any semiconductor (Group III-V) whose doping property can be modified by the introduction of an isovalent element.

The invention also provides for a method to fabricate a low resistivity non-alloyed ohmic contact with n-type Group II-VI semiconductor that is co-implanted with oxygen and a Group VII element.

BRIEF DESCRIPTION OF THE DRAWINGS

The present invention will be readily understood by the following detailed description in conjunction with the accompanying drawings.

DETAILED DESCRIPTION OF THE PREFERRED EMBODIMENTS

Figure 1:
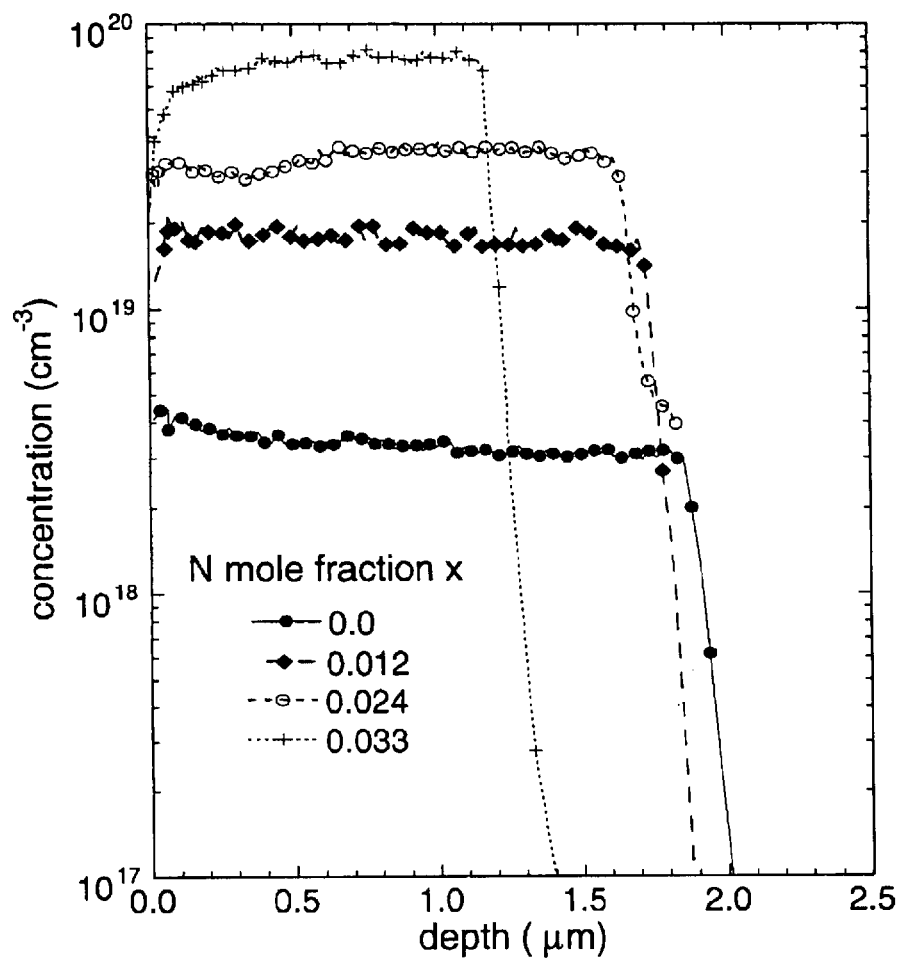
FIG. 1 shows free electron concentration profiles for the $Ga_{1-3x}In_{3x}N_xAs_{1-x}$ alloys films with x=0-0.033 measured by the electrochemical capacitance-voltage profiling technique.

Reference will now be made in detail to some specific embodiments of the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention. All references cited herein are expressly incorporated herein by reference in their entirety for all purposes.

In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

In one embodiment of the invention there is disclosed a process for making a non-alloyed ohmic contact for a semiconductor comprising implanting a Group VI element in a Group III-V wafer, and implanting Nitrogen in the n-type layer created by the group VI implantation (a) on the Group III-V wafer, and annealing the wafer. The process of annealing may be accomplished by heating or pulsed laser melting. The heating is performed at a temperature that is lower than the melting point of the wafer semiconductor. Thus in a preferred case, the heating is accomplished at a temperature lower than the melting temperature of GaAs. Generally the temperature is between 800 and 1200° C. for a time duration of seconds. The Group VI element is S, Se or Te.

The Group VI element is implanted to a depth of less than about 2000 Å. The Group VI element may be implanted to a dopant concentration of about $5 \times 10^{19}$ $cm^{-3}$. The contact preferably comprises $GaN_xAs_{1-x}$:Group VI, where x is approximately 0.02 and the contact has a resistivity of less than $10^{-6}$ ohm-$cm^2$.

In another embodiment of the invention there is disclosed a process for making a non-alloyed ohmic contact for a semiconductor comprising implanting a Group VII element in a Group II-VI wafer, and implanting Oxygen in the n-type layer created by the group VII implantation (a) on the Group II-VI wafer, and annealing the wafer. The process of annealing may be accomplished by heating or pulsed laser melting. The heating is performed at a temperature that is lower than the melting point of the wafer semiconductor.

In another embodiment of the invention there is disclosed the implantation of a Group VI of VII element into a wafer comprising either a Group III-V or Group II-VI semiconductor having already implanted therein either N or O atoms, respectively.

By "low resistivity" it is meant a resistivity less than $10^{-6}$ ohm-$cm^2$.

By "non-alloyed" it is meant the contact metal does not inter mix with the semiconductor underneath to form an alloy.

By "co-implantation" it is meant the ion implantation or growth of two or more elements or ions. This may occur sequentially or simultaneously.

By "Group III-V" alloys it is meant to include semiconductor materials such as GaAs, InP and all other binary, ternary and quarternary alloys of the respective Group elements.

By "Group II-VI" alloys it is meant to include semiconductor materials such as ZnS, CdS and all other binary, ternary and quarternary alloys of the respective Group elements.

By "Nitrogen atoms" it is to be understood that the term includes highly electronegative atoms substituting metallic anions in group III-V and group II-VI semiconductors.

It is understood that the terms PLA (pulsed laser annealing) and PLM (pulsed laser melting) are used to describe the same annealing phenomena process in semiconductors.

Note that during in the following examples it is preferred that the time period used for the heating be as short as possible. There is generally an inverse relationship between the time for heating and the temperature used. One of ordinary skill in the art can readily optimize the proper parameters for the particular Group III-V or Group II-VI semiconductor.

EXAMPLES

Example 1
N-Induced Enhancement of N-Type Doping in GaNAs Alloys

Se-doped $Ga_{1-3x}In_{3x}As_{1-x}N_x$ films (1–3 $\mu$m thick) with x ranging from 0 to 0.033 were grown on GaAs substrates by metalorganic vapor phase epitaxy (OMVPE). The growth temperatures ranged from 550° and 580° C. and $H_2Se$ was used as the Se source. The In content in the films was measured by Rutherford backscattering spectrometry (RBS). The atomic fraction of N atoms incorporated into the As sublattice (x) was determined using reflection (004) double-crystal x-ray diffraction (XRD) measurements The RBS-measured In contents in the films were equal to 3x to within 20%; this ratio produces films that are lattice-matched to the GaAs substrate. Secondary ion mass spectroscopy (SIMS) using a $Cs^+$ beam was used to measure the concentration of the Se dopant. The net sheet density and mobility of the free carriers were determined from Hall effect measurements in the Van der Pauw geometry. The net donor concentration profiles were obtained by electrochemical capacitance-voltage (ECV) profiling using 0.2M NaOH: EDTA as the electrolyte.

Figure 2:
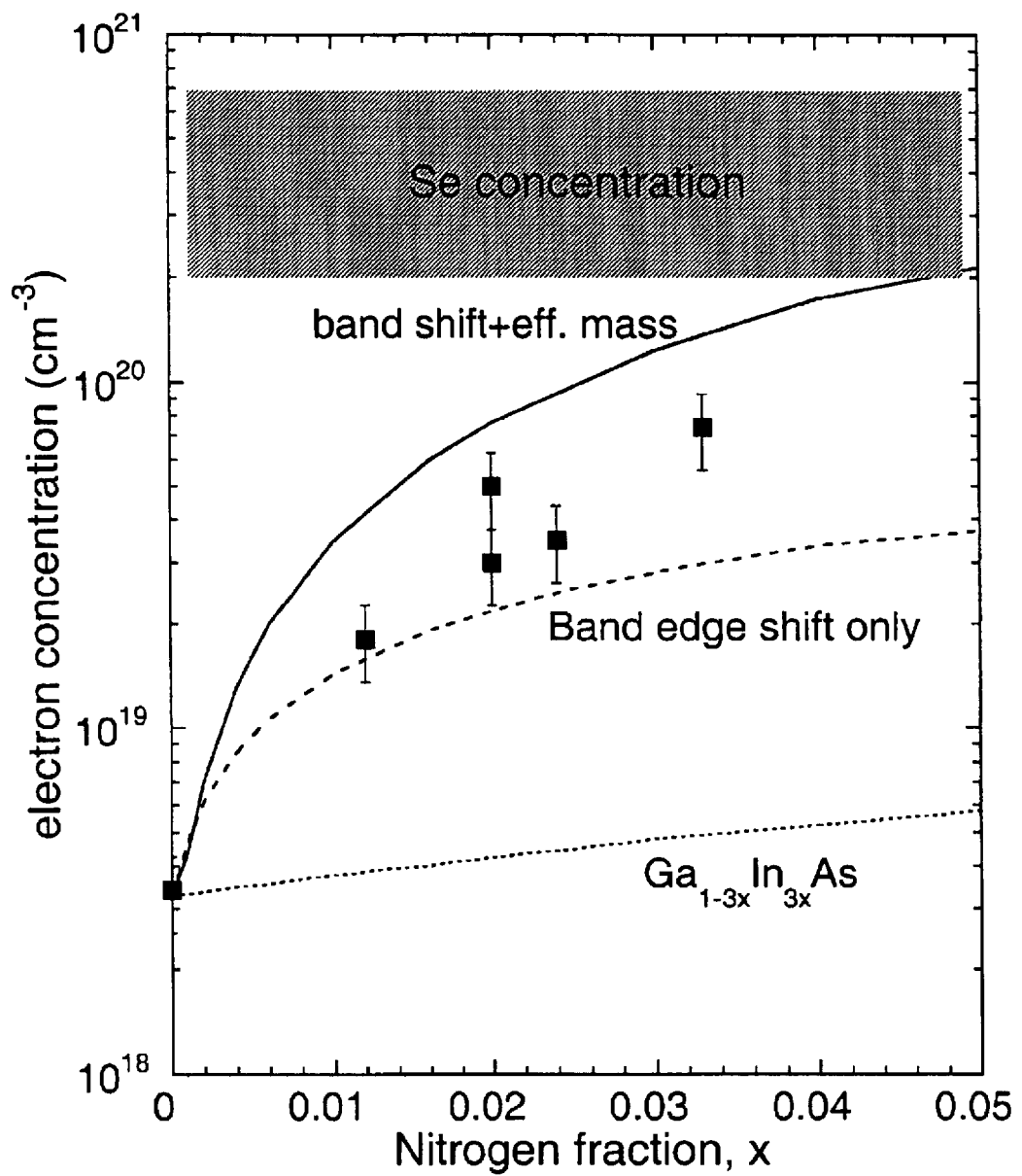
FIG. 2 displays a comparison of the measured maximum electron concentration with the calculated values as a function of N fraction in $Ga_{1-3x}In_{3x}N_xAs_{1-x}$. Two different cases of the calculated $n_{max}$ are shown: one included effects of downward shift of the conduction band only (dashed curve) and the other included both the band shift and the enhancement of the density of states effective mass (solid curve). The calculated $n_{max}$ for samples with no N (i.e. the effects from the bandgap lowering produced by In incorporation only are considered) are also shown in the figure (dotted curve). The shaded area indicates the range of Se concentration in these samples.

Profiles of the net donors for the $Ga_{1-3x}In_{3x}N_xAs_{1-x}$ films with x=0 to 0.033 measured by ECV are shown in FIG. 1. It should be noted that the ECV-measured net donor concentrations for the Se doped $Ga_{1-3x}In_{3x}N_xAs_{1-x}$ films agree well (within 20%) with the free electron concentrations obtained by Hall effect measurements. For simplicity, hereafter, we refer to both the Hall and ECV measured concentrations as the free electron concentration. Since the Se atomic concentrations in these films are at least an order of magnitude higher than the free electron concentration, the measured free electron concentration shown in FIG. 2 can be considered to be the maximum achievable free electron concentration, $n_{max}$ for the specific growth conditions. FIG. 2 graphs $n_{max}$ vs. x; $n_{max}$ increases strongly with x with a maximum observed value of $7 \times 10^{19}$ cm$^{-3}$ for x=0.033. This value is ca. 20x that observed for a GaAs film ($3.5 \times 10^{18}$ cm$^{-3}$) grown under the same conditions.

These results are consistent with the predictions of the amphoteric defect model when the changes to the conduction band induced by nitrogen are described by an anticrossing between a localized N state and the extended states of the conduction band. The repulsive interaction of the localized N state with the conduction band edge states pushes the latter states down in energy, lowering the observed band gap and moving the conduction band edge closer in energy to the Fermi stabilization energy.induces strong distortions to the conduction band of GaAs. In addition the interaction also results in a the considerable flattening of the lower subband near its minimum conduction band leading to a large enhancement of the electron effective mass in the lower subband. Both of these N-induced effects contribute to the increase in the maximum electron concentration in the film.

Example 2
High Free Electron Concentration in Donor Ion Implanted GaNAs Alloys

In this case the donor element was introduced in a thin film GaNAs externally by ion implantation technique. S ions were implanted in a MOCVD-grown $GaN_xAs_{1-x}$ thin film (1.1 μm thick with nominal x=0.013) and a semi-insulating (100) GaAs wafer (SIGaAs) with multiple energies of 810, 390, 160 and 55 keV and doses of $2.0 \times 10^{15}$, $1.0 \times 10^{15}$, $5.0 \times 10^{14}$ and $2.0 \times 10^{14}$/cm$^2$, respectively. This created a close to uniform S atomic concentration of $4 \times 10^{19}$/cm$^3$ throughout the $GaN_xAs_{1-x}$ layer. The samples were maintained at 200° C. during implantation to minimize structural damage. Rapid thermal annealing (RTA) was performed at 940° C. for 10 sec. with a GaAs proximity cap in an $N_2$ ambient.

The sheet free carrier density $n_H$ and mobility $\mu_H$ in the annealed samples were measured by the Hall effect technique in the Van de Pauw geometry while the net ionized donor concentration profiles were determined by electrochemical capacitance-voltage (ECV) profiling measurements. The composition of the $GaN_xAs_{1-x}$ layer and the implanted S atomic profiles were also measured by secondary ion mass spectrometry (SIMS). The fraction of N atoms incorporated into the As sublattice (x) was determined using reflection (004) double-crystal x-ray diffraction (XRD) measurements.

Figure 3:
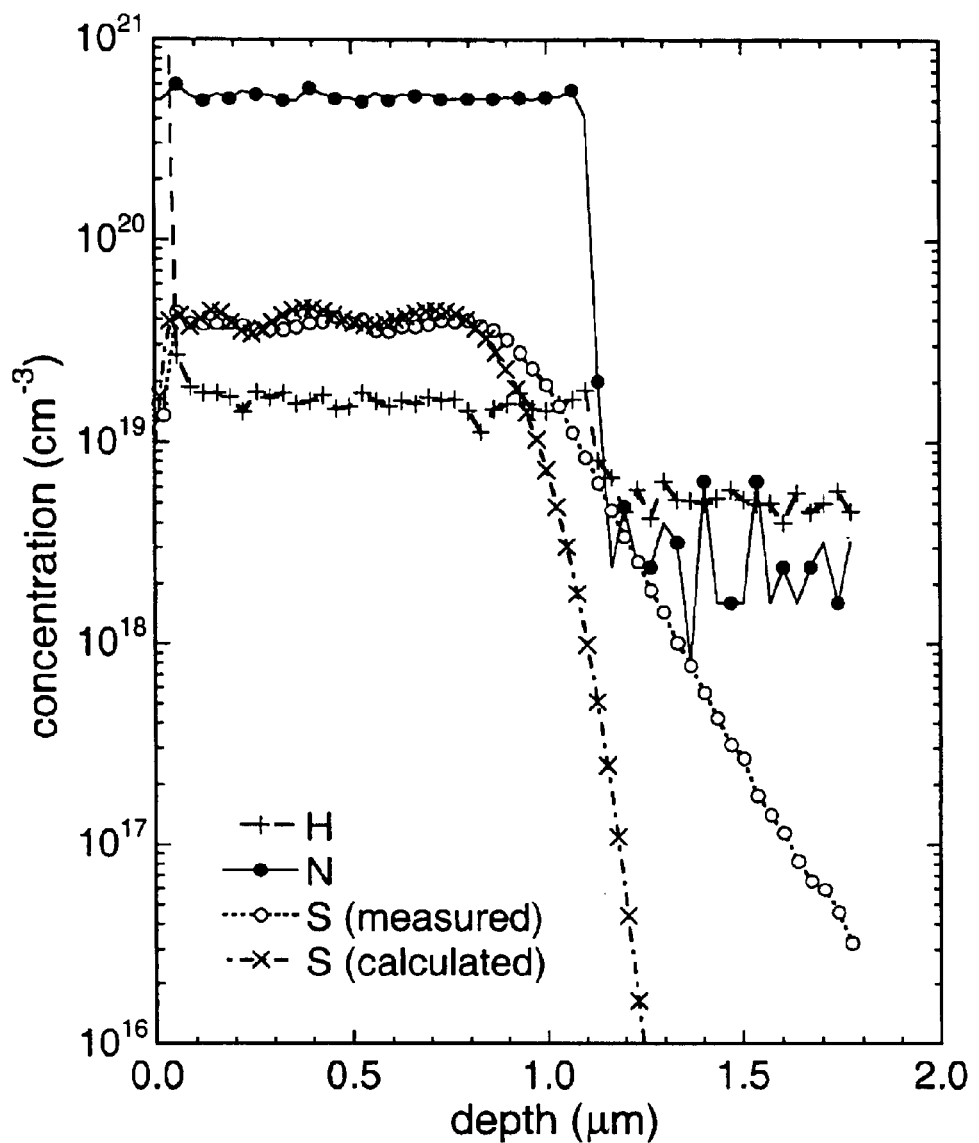
FIG. 3 shows the N, H and S atomic profiles measured with secondary ion mass spectrometry (SIMS) in the as-implanted $GaN_xAs_{1-x}$ sample.

The N, H and S atomic profiles measured with SIMS in the as-implanted $GaN_xAs_{1-x}$ sample are shown in FIG. 3 together with the S distribution calculated by the PROFILE code, (PROFILE, Ion Beam Profile Code version 3.20, Implant Sciences Corp. 107 Audubon Rd., #5, Wakefield, Mass. 01880). Note that the S distribution in the SIGaAs sample is similar to that in the $GaN_xAs_{1-x}$ film. The N concentration in the alloy layer was ≈$3.6 \times 10^{20}$ cm$^{-3}$ (or x≈0.016), in good agreement with that measured by XRD which yielded x=0.013. After RTA, XRD revealed that x had decreased to 0.008, indicating that a fraction of the N was "deactivated", i.e. they were displaced from their substitutional As sites. Since we measured the free electron concentration of the samples after RTA, hereafter we consider the N content in the film to be x=0.008.

Figure 4:
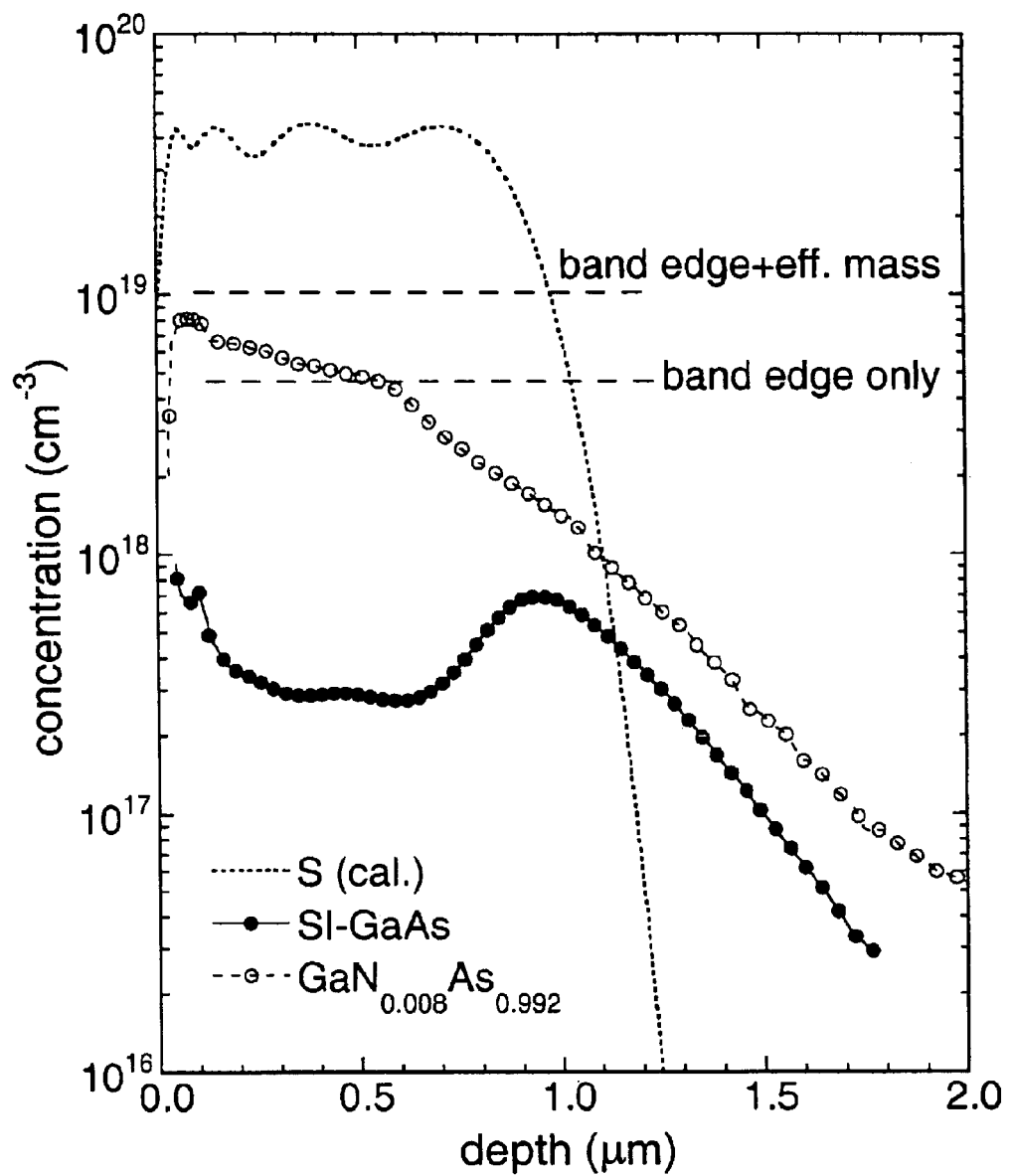
FIG. 4 displays a direct comparison of the free electron concentration profiles for the S implanted $GaN_xAs_{1-x}$ and SI—GaAs samples after rapid thermal annealing (RTA).

FIG. 4 displays the free electron concentration profiles for the S implanted $GaN_xAs_{1-x}$ and SI—GaAs samples after RTA. A striking difference in the free electron concentration n measured in the SI—GaAs and the $GaN_xAs_{1-x}$ samples is shown in FIG. 4. In the SI—GaAs sample, n~$2.5 \times 10^{17}$ cm$^{-3}$ was measured in the bulk of the implanted layer, with a higher n~$5 \times 10^{17}$ cm$^{-3}$ towards to end of the implantation profile. In the $GaN_xAs_{1-x}$ sample we observed values of n as high as $6 \times 10^{18}$ cm$^{-3}$, a factor of >20 times higher than that in SI—GaAs.

The maximum electron concentration attained by S implantation in GaAs reported in the literature is ~$2 \times 10^{18}$ cm$^{-3}$ with typical implantation parameters and annealing temperatures below 1000° C., much higher than that obtained for the SI—GaAs sample in this work. This may also be due to the high energy implantation and the non-optimized RTA process. We emphasize here the direct comparison between the two samples that were processed (implanted and annealed) together in precisely the same way.

The enhancement of the free electron concentration in the $GaN_xAs_{1-x}$ sample can be explained quantitiatively by the N-induced modifications in the conduction band. As seen in FIG. 4, only a fraction of S atoms, 0.7% in SI—GaAs and ~17% in $GaN_xAs_{1-x}$, provide free electrons. It has been shown previously that in GaAs the reduced donor activity is a result of compensation by highly localized charged gallium vacancy acceptors. Since the formation energy of native defects depends on the location of the Fermi level ($E_F$) there must be a position of $E_F$ where a maximum native defect concentration will be obtained ($EF_{max}$). Using the measured free electron concentration of $2.5 \times 10^{17}$ cm$^{-3}$, we estimate that $EF_{max}$ is located approximately at the conduction band edge in the SI—GaAs sample. Since in $GaN_xAs_{1-x}$ the band anticrossing results in a downward shift of the conduction band edge relative to the N-level, we can assume that $EF_{max}$ is located at the same position as in the SI—GaAs with respect to the common energy reference corresponding to the energy of the highly localized defect levels. To calculate the $n_{max}$ in $GaN_xAs_{1-x}$ we have used the dispersion relation derived from the band anticrossing model to find the density of states in the lower subband E_(k). Integration of this density of states with the Fermi-Dirac distribution function yields about $1 \times 10^{19}$ cm$^{-3}$ for the $n_{max}$ expected in the $GaN_{0.008}As_{0.992}$ sample. This value is in a reasonably good agreement with our measured concentration of $6 \times 10^{18}$ cm$^{-3}$.

Example 3
Increased donor activation by N and donor ion co-implantation in GaAs The success in overcoming the maximum electron concentration in GaAs by N induced changes in the conduction band led to the possibility to form a "ultra-highly doped" n-type GaAs using a simple ion implantation technique compatible with the processing of semiconductor devices. Such a "ultra-highly doped" layer can be very useful in the fabrication of low-resistivity ohmic contact structures in n-type GaAs.

N and S ions were implanted sequentially into a semi-insulating GaAs wafer at room temperature. S ions were implanted at energies of 180 keV, 70 keV and 30 keV with doses of $1\times10^{15}$, $2.9\times10^{14}$ and $1.35\times10^{14}$ cm$^{-3}$, respectively. N ions were implanted at 160 keV, 77 keV and 35 keV with doses of $8\times10^{15}$, $3.15\times10^{15}$ and $1.6\times10^{15}$ cm$^{-2}$, respectively. These implantations created a ~0.35 μm thick layer with N concentrations $3.6\times10^{21}$ cm$^{-3}$ with the top ~0.2 μm doped with a uniform S concentration of $6.3\times10^{19}$ cm$^{-3}$. Rapid thermal annealing (RTA) was performed in a flowing N$_2$ ambient in the temperature range of 800–950° C. for 10-120 s with the sample surface protected by a blank GaAs wafer. The net sheet free carrier density and the mobility in the annealed samples were determined by Hall and resisitivity measurements in the Van de Pauw geometry while the net donor concentration profiles were determined by electrochemical capacitance-voltage (ECV) profiling measurements.

Hall effect measurements show that in GaAs samples implanted with S only, the sheet density of free electrons increases while the Hall mobility decreases as a function of the RTA temperature. At 945° C., the sheet density of free electrons is $2.5\times10^{13}$ cm$^{-2}$ with Hall mobility of 2200 cm$^2$/V-s, corresponding to an overall activation efficiency of only 1.7%. The free electron concentration profiles for the S implanted GaAs samples annealed at different conditions are shown in FIG. 5 together with the as-implanted S profile calculated using the PROFILE code.

Figure 5:
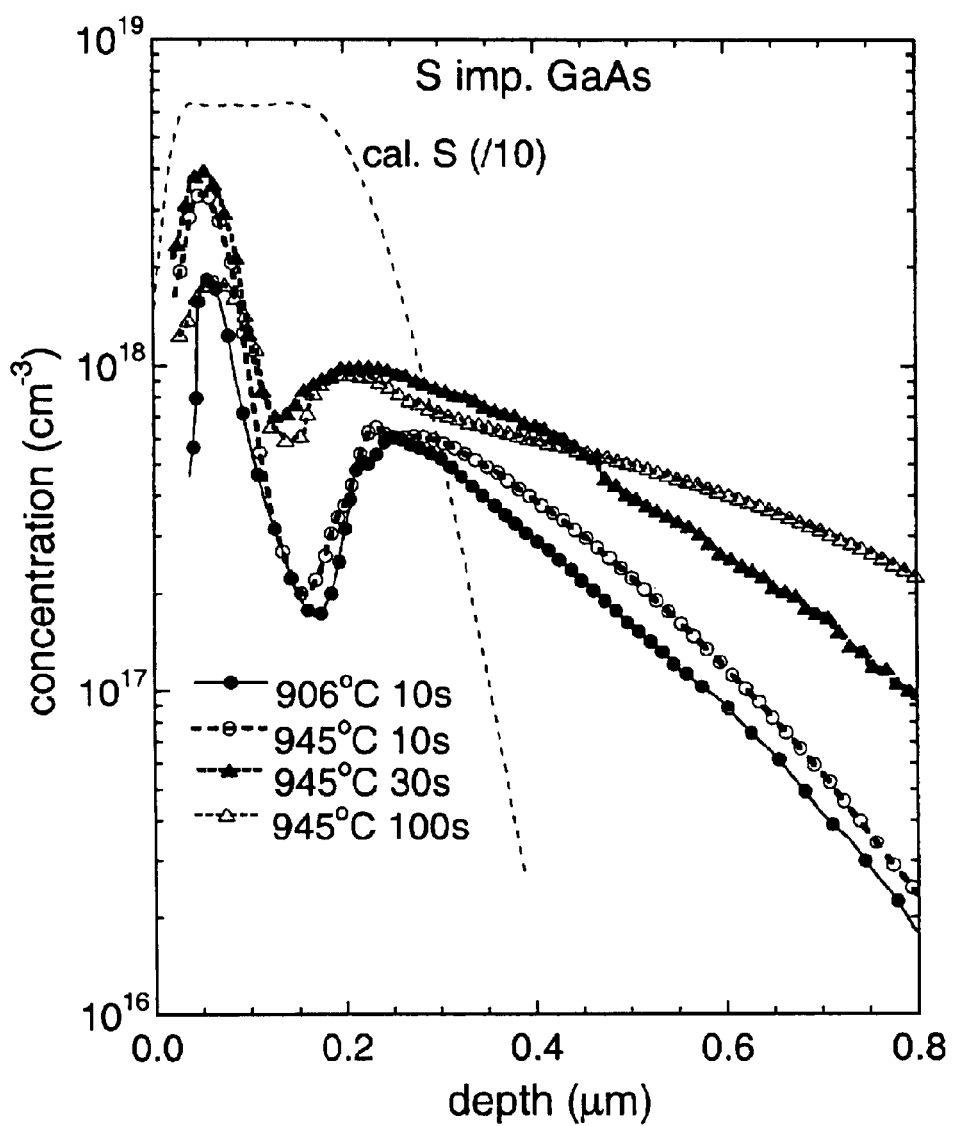
FIG. 5 shows the free electron concentration profiles for the S implanted GaAs samples annealed at different conditions.
Figure 6:
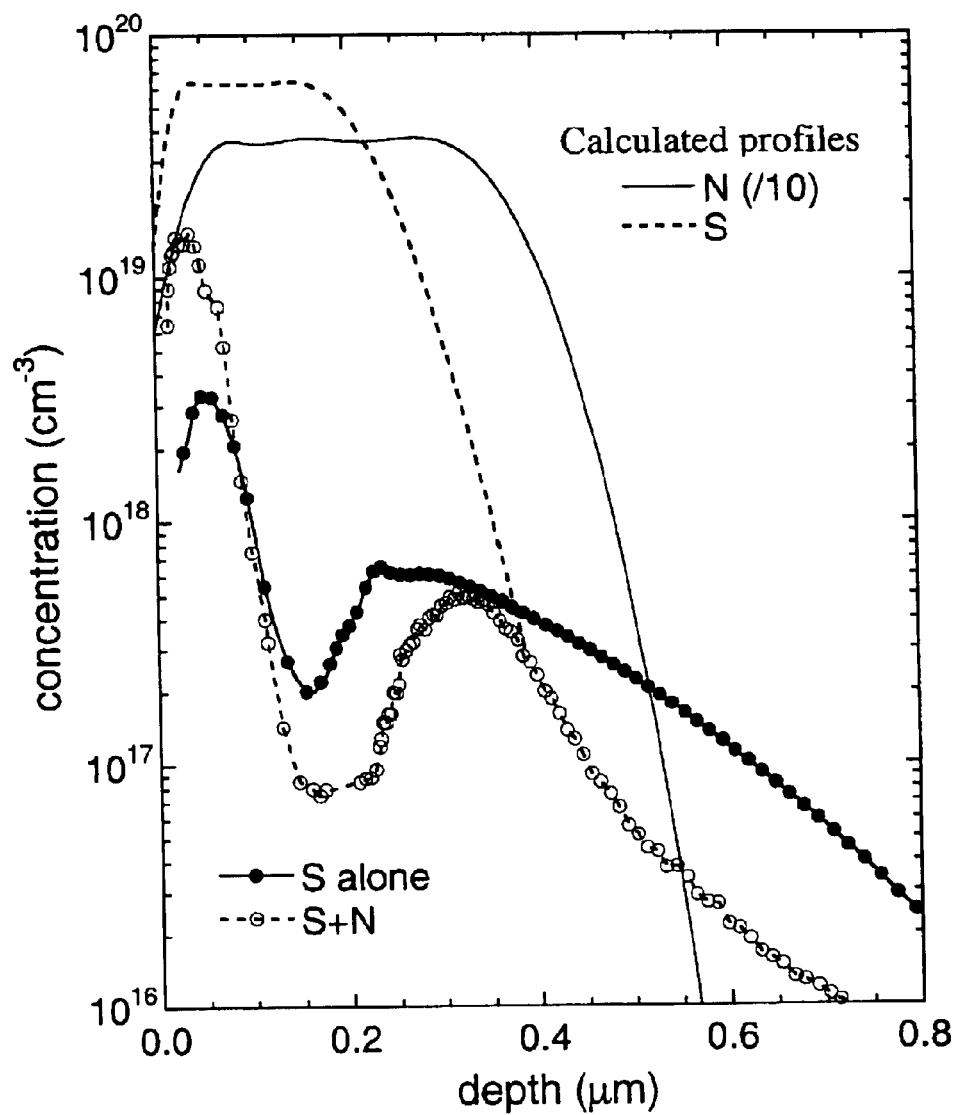
FIG. 6 shows a comparison of the free electron concentration profiles determined by electrochemical capacitance-voltage (ECV) measurements for the GaAs samples implanted with S alone and co-implanted with S and N (S+N) after RTA at 945° C. for 10 sec.

FIG. 5 shows that for all annealing conditions the electron concentration in the surface layer (~500 Å) is enhanced. This may simply be caused by an increased concentration of As vacancies due to As loss during annealing, which would promote substitution of S in the active As sublattice. Although the implanted S concentration is $>6\times10^{19}$ cm$^{-3}$, FIG. 5 reveals that the $n_{max}$ achieved with the present annealing conditions is smaller than $4\times10$ cm$^3$, corresponding to a maximum activation efficiency of only 6%. It has been shown previously that in GaAs this reduced activity of donors is the result of compensation by highly localized charged gallium vacancy acceptors. Since the formation energy of such defects depends on the location of the Fermi level ($E_F$) there is a maximum position for Fermi level $E_F$ that can be achieved by doping ($E_{Fmax}$). FIG. 6 shows a comparison of the ECV determined free electron concentration profiles for the GaAs samples implanted with S alone and co-implanted with S and N (S+N) after RTA at 945° C. for 10 s. The calculated, as-implanted S and N atomic distributions are also shown in the figure. It is interesting to point out that S atomic diffusion is reduced when N co-implantation was carried out. This may be due to the reduced availability of As vacancies in the S+N sample especially in the region >0.4 μm. The most striking difference in the electron concentration profiles between the S only and (S+N) samples shown in FIG. 6 is the much enhanced electron concentration in the (S+N) sample in a narrow region (~500 Å) near the surface. Enhanced activation due to additional implantation damage by co-implantation of an inert element (e.g. Ar) has been observed for light dopant ions (e.g. C or Be) in GaAs and InP. However, for heavy dopant ions (such as Zn or Ge), reduced electrical activation was observed with additional implantation damage. S implantation in this experiment introduced sufficient damage to amorphize a layer of GaAs ~3000 Å thick. Therefore additional damage by the lighter N ions is not expected to have any positive effect in the electrical activation of the S. The much-enhanced maximum free electron concentration in this thin layer is clearly attributable to the presence of N. The large reduction of the electron concentration in the (S+N) sample in the As rich region at about 0.1 μm below the surface could also be related to a reduced availability of group V sites and an increased $V_{Ga}$ concentration in this region. The effect is exacerbated in the (S+N) sample where both S and N compete for the same group V element sites.

It has been shown previously that the much higher activation efficiency of group VI donors in GaN$_x$As$_{1-x}$, is the direct result of N-induced modifications in the conduction band, including the formation of the lower subband that causes the bandgap energy reduction; and the considerable flattening of the lower subband near its minimum leading to a large enhancement of the electron effective mass. The measured highest free electron concentration of $3.3\times10^{18}$ cm$^{-3}$ near the surface of the GaAs sample implanted with S only (FIG. 6), corresponds to $E_{Fmax}$ located at ~0.12 eV above the conduction band edge. The position of $E_{Fmax}$ for the (S+N) sample can be assumed is be located at the same position as in the S only sample with respect to the common energy reference corresponding to the energy of the highly localized defect levels (EFS). Considering both the downward shift of the conduction band edge and an increase in the conduction band effective mass as predicted by the band anticrossing model, the high $n_{max}$ in the near-surface region of the (S+N) sample (~$1.5\times10^9$cm$^3$) implies that the N content in this thin near-surface nitride layer is x=0.0032. This value is in good agreement with the calculated N concentration in this surface region (x≈0.003–0.01). With this N content the conduction band edge is shifted downward by 77 meV and the conduction band effective mass at the Fermi energy is ~3 times that of GaAs.

Such an ultra-highly doped n-type GaAs surface layer can be utilized for low contact resistivity Ohmic contact fabrication. Metal contacts formed on this heavily doped material will have a very narrow depletion width. With the narrow depletion width and the reduced barrier equal to the reduction of the band gap in the nitride layer a large reduction of the contact resistivity, down to $10^{-7}$-$10^{-8}$ ohm-cm$^2$ is expected. These resistivities are one to two orders of magnitude lower than those of the current state of the art contacts It should be noted that the formation of the ultra-highly n-type GaAs by co-implantation of nitrogen and a group VI donor element requires a post-implantation annealing process. This annealing process provide energy for both the nitrogen and donor atoms to substitute the As sublattice. In the experiments described above, this annealing process was achieved by rapid thermal annealing in a time scale of 10 seconds. Our recent experiments indicates that the incorporation of N is many times (4×) more efficient when N implanted GaAs underwent pulsed laser melting (PLM). In the PLM process, the N implanted GaAs was annealed by a nanosecond laser pulsed that melted the surface layer (~200 nm thick). The melting occurs in the range of a few hundred nanosecond followed by rapid solidification proceeding from the GaAs substrate. Such a process has proven to be an effective means for the synthesis of metastable alloys. We believe that combining the co-implantation and laser melting processes, a thin layer of GaAs with electron concentration higher than that reported here can be achieved.

Example 4

Pulsed laser annealing was accomplished according to Yu et al. Applied Physics Letters Vol. 80, No. 21, 3958–3960, the contents of which are incorporated by reference in its entirety.

Semi-insulating GaAs substrates were implanted with N$^+$ at multiple energies creating ~3000 Å layers of GaAs with a uniform N concentration of ~$3.9\times10^{20}$ cm$^{-3}$. This corresponds to an $x_{imp}$~0.018. It is important to recognize that only a fraction of the implanted N will occupy As sublattice sites (N$_{As}$) after annealing and thus become "active" ($x_{act}$).

The N+-implanted GaAs samples were pulsed-laser melted in air using an XeCl excimer laser (λ=308 nm) with pulse duration ~30 ns. After passing through a multi-prism homogenizer, the fluence at the sample ranged between 0.3 and 0.8J/cm². The melt duration was determined by monitoring the time resolved reflectivity (TRR) of the samples using an argon-ion laser. TRR confirmed that the GaAs samples were indeed melted with melt duration of approximately 150 ns and 345 ns for laser fluences of 0.35 and 0.79 J/cm², respectively. Some of the samples were rapid thermally annealed (RTA) after the PLA at temperatures between 800 and 950° C. for 10 seconds in flowing $N_2$.

The crystalline structure of the $GaN_xAs_{1-x}$ samples was studied by channeling Rutherford backscattering spectrometry (c-RBS) in the <100> direction. The band gap of the films was measured using photomodulated reflectance (PR) at room temperature. Radiation from a 300W halogen tungsten lamp dispersed by a 0.5 m monochromator was focused on the samples as a probe beam. A chopped HeCd laser beam (λ=442 nm or 325 nm) provided the photomodulation. PR signals were detected by a Si photodiode using a phase-sensitive lock-in amplification system. The values of the band gap and the line width were determined by fitting the PR spectra to the Aspnes third-derivative functional form.

Figure 7:
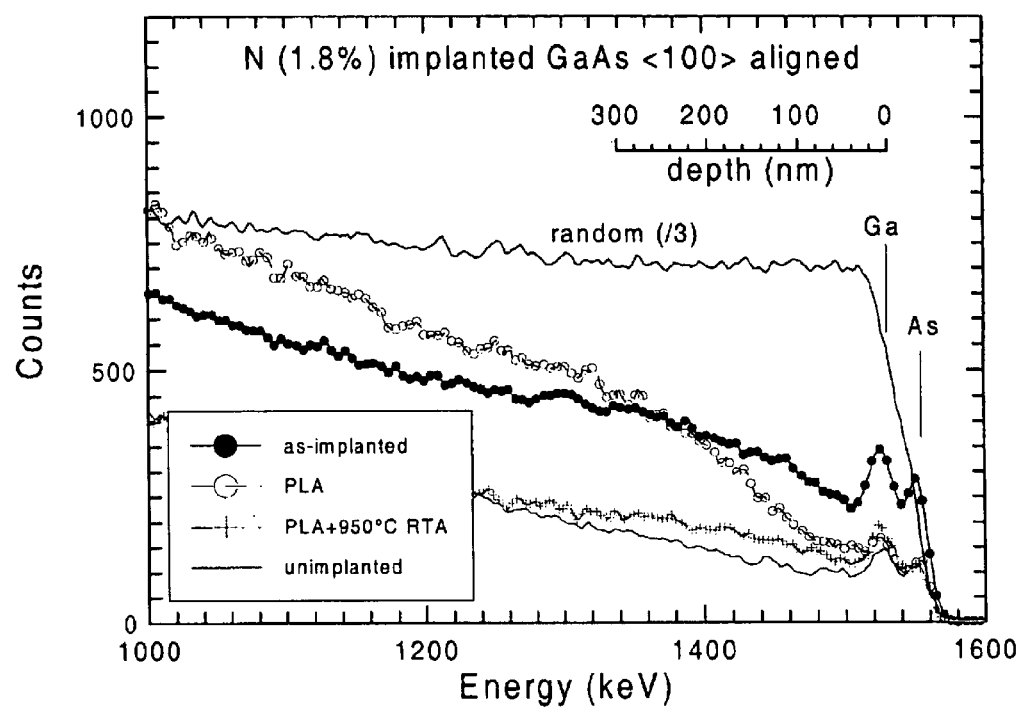
FIG. 7 shows Channeling Rutherford backscattering spectra (c-RBS) taken in the <100> axial direction from $N^+$-implanted GaAs samples as implanted, annealed with laser pulse fluence of 0.35 $J/cm^2$ (LA) and with subsequent RTA at 950° C. for 10 s after PLA (PLA+950° C. RTA). The <100> aligned and random spectra from an unimplanted GaAs sample are also shown.

FIG. 7 shows the c-RBS spectra from unimplanted GaAs and N+-implanted GaAs samples as-implanted and after PLA with pulse fluence of 0.35 J/cm² (PLA) and subsequently RTA at 950° C. after PLA (PLA+950° C. RTA). The <100> aligned spectrum from the as-implanted GaAs sample reveals that the sample is highly damaged yet still crystalline after N+ implantation. The high dechanneling and the absence of a direct scattering peak in the spectrum suggest that the majority of the damage present in the top 300 nm layer of the sample consists of extended crystalline defects.

The <100> aligned spectrum from the sample exposed to a pulse fluence of 0.35J/cm² shows a thin layer (~100 nm) of good crystalline materials on a defective underlayer. The high dechanneling rate in the region deeper than ~10 nm suggests that only the top 100 nm of GaAs was melted and epitaxially regrown from the liquid phase. Since the underlying GaAs was defective, a high concentration of defects is expected to accumulate at the regrowth interface. This gives rise to the high dechanneling rate between 100 and 200 nm. In order to heal these interfacial defects observed in the PLA sample, RTA was carried out for 10 s in the temperature range of 800–950° C. c-RBS measurements on the PLA+ 950° C. RTA sample shows much improved crystalline quality.

Figure 8:
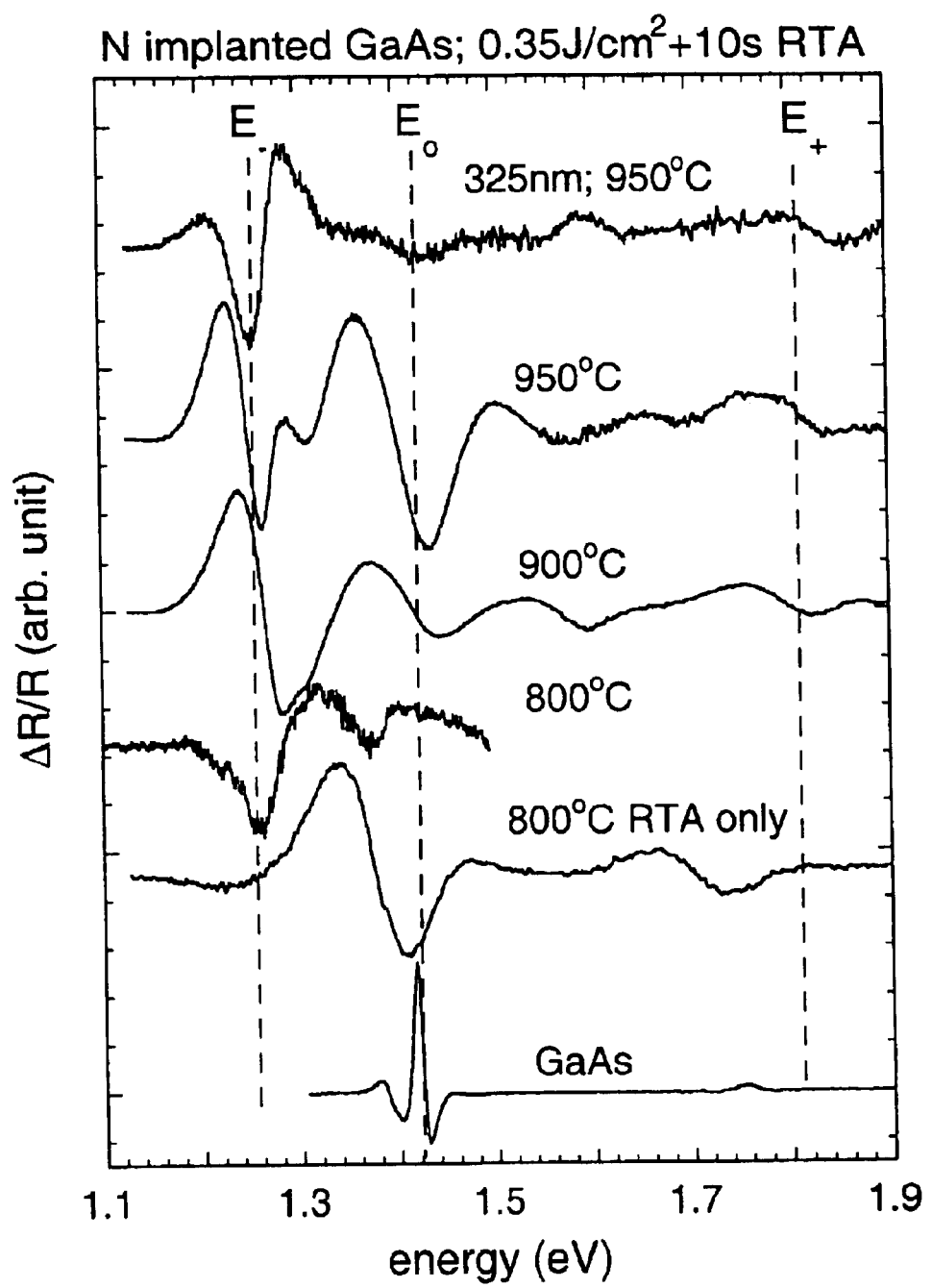
FIG. 8 shows a series of photomodulated reflectance (PR) spectra ($\lambda$=442 nm modulation) from $N^+$-implanted GaAs after PLA (laser fluence=0.35$J/cm^2$) and RTA at different temperatures. The top most spectrum was obtained from a PLA+950° C. RTA sample using the 325-nm line of a HeCd laser as a modulation source. All other spectra were obtained using the 442 nm line. Spectra from unimplanted GaAs, and $N^+$-implanted GaAs subjected to RTA at 800° C. are also shown for comparison.

Photomodulated reflectance (PR) measurements of the sample subjected only to PLA do not show any clear optical transition. This is consistent with the c-RBS results that show higher yields for this sample than the unimplanted sample, indicating that the regrown layer is still defective. Distinct optical transitions are observable only in the PLA samples after RTA at temperatures higher than 800° C. FIG. 8 shows a series of PR spectra from samples processed by PLA and RTA together with an unimplanted GaAs and an N+-implanted GaAs sample subjected only to RTA at 800° C. PR spectra from the laser melted and RTA (PLA+RTA) samples exhibit several well-resolved interband transitions that are distinctly different in energy from the fundamental band gap transition in the unimplanted GaAs ($E_0$). The main spectral feature at 1.26 eV observed in all of the PLA+RTA samples is attributed to a $GaN_xAs_{1-x}$ layer formed via epitaxial regrowth from the melt. The line width of this transition narrows as the RTA temperature increases, suggesting that the quality of this $GaN_xAs_{1-x}$ layer improves with RTA temperature, which is in good agreement with the c-RBS results.

CONCLUSION

Although the foregoing invention has been described in some detail for purposes of clarity of understanding, those skilled in the art will appreciate that various adaptations and modifications of the just described preferred embodiments can be configured without departing from the scope and spirit of the invention. Therefore, the described embodiments should be taken as illustrative and not restrictive, and the invention should not be limited to the details given herein but should be defined by the following claims and their full scope of equivalents.

What is claimed is:

1. A process for making a non-alloyed ohmic contact for a semiconductor comprising:

a) implanting a Group VI element in a Group III-V wafer, and b) implanting Nitrogen in the layer created by the Group VI implantation (a) in the Group III-V wafer, and c) annealing the wafer.

2. A process for making a non-alloyed ohmic contact for a semiconductor as claimed in claim 1, wherein the annealing is accomplished by heating.

3. A process for making a non-alloyed ohmic contact for a semiconductor as claimed in claim 2, wherein the heating is at a temperature that is lower than the melting point of GaAs.

4. A process for making a non-alloyed ohmic contact for a semiconductor as claimed in claim 2, wherein the heating is at a temperature of between 800 and 1200° C.

5. A process for making a non-alloyed ohmic contact for a semiconductor as claimed in claim 1, wherein the annealing is accomplished by pulsed laser melting.

6. A process for making a non-alloyed ohmic contact for a semiconductor as claimed in claim 1, wherein the Group VI element is S or Se.

7. A process for making a non-alloyed ohmic contact for a semiconductor as claimed in claim 1, wherein the Group VI element is Te.

8. A process for making a non-alloyed ohmic contact for a semiconductor as claimed in claim 1, wherein the Group VI element is implanted to a depth of less than about 2000 Å.

9. A process for making a non-alloyed ohmic contact for a semiconductor as claimed in claim 1, wherein the Group VI element is implanted to a dopant concentration of about $5 \times 10^{13}$ cm$^{-3}$.

10. A process for making a non-alloyed ohmic contact for a semiconductor as claimed in claim 1, wherein the Nitrogen is implanted to a depth of less than about 2000 Å.

11. A process for making a non-alloyed ohmic contact for a semiconductor as claimed in claim 2, wherein the annealing by heating is accomplished for 5 to 20 seconds.

12. A process for making a non-alloyed ohmic contact for a semiconductor as claimed in claim 1, wherein the Group III-V wafer comprises GaAs.

* * * * *